(12) United States Patent
Bedell et al.

(10) Patent No.: US 7,935,612 B1
(45) Date of Patent: May 3, 2011

(54) LAYER TRANSFER USING BORON-DOPED SIGE LAYER

(75) Inventors: Stephen Bedell, Yorktown Heights, NY (US); Keith Fogel, Yorktown Heights, NY (US); Daniel Inns, Chester Hill (AU); Jeehwan Kim, Yorktown Heights, NY (US); Devendra Sadana, Yorktown Heights, NY (US); James Vichiconti, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/700,801

(22) Filed: Feb. 5, 2010

(51) Int. Cl.
*H01L 21/30* (2006.01)
*H01L 21/02* (2006.01)

(52) U.S. Cl. .................. 438/458; 438/759; 257/616
(58) Field of Classification Search .................. None
See application file for complete search history.

(56) References Cited

U.S. PATENT DOCUMENTS

| | | | |
|---|---|---|---|
| 6,323,108 B1 | 11/2001 | Kub et al. | |
| 6,486,008 B1 | 11/2002 | Lee | |
| 7,229,899 B2 | 6/2007 | Moriceau et al. | |
| 7,351,644 B2 | 4/2008 | Henley | |
| 7,399,681 B2 | 7/2008 | Couillard et al. | |
| 2001/0046746 A1* | 11/2001 | Yokokawa et al. | 438/311 |
| 2004/0029358 A1* | 2/2004 | Park et al. | 438/458 |
| 2005/0153524 A1 | 7/2005 | Maa et al. | |
| 2007/0287269 A1 | 12/2007 | Yokokawa et al. | |
| 2008/0070340 A1 | 3/2008 | Borrelli et al. | |
| 2008/0261055 A1 | 10/2008 | Chu et al. | |
| 2010/0133536 A1* | 6/2010 | Syllaios et al. | 257/53 |

FOREIGN PATENT DOCUMENTS

JP 2003017671 A * 1/2003

OTHER PUBLICATIONS

Shao, et al., Plasma hydrogenation of strained SI/SiGe/Si heterostructure for layer transfer without ion implantation, Appliet Physics Letters 87, 2005, American Institute of Physics.
Usenko, et al., Thinner Silicon-on-Insulator Using Plasma Hydrogenation, Applied Physics, Aug. 2002, pp. 5021-5023, vol. 41, No. 8, The Japan Society of Applied Physics.
International Search Report dated Mar. 4, 2011.

* cited by examiner

*Primary Examiner* — Alonzo Chambliss
(74) *Attorney, Agent, or Firm* — Cantor Colburn LLP; Joseph Petrokaitis

(57) ABSTRACT

A method for layer transfer using a boron-doped silicon germanium (SiGe) layer includes forming a boron-doped SiGe layer on a bulk silicon substrate; forming an upper silicon (Si) layer over the boron-doped SiGe layer; hydrogenating the boron-doped SiGe layer; bonding the upper Si layer to an alternate substrate; and propagating a fracture at an interface between the boron-doped SiGe layer and the bulk silicon substrate. A system for layer transfer using a boron-doped silicon germanium (SiGe) layer includes a bulk silicon substrate; a boron-doped SiGe layer formed on the bulk silicon substrate, such that the boron-doped SiGe layer is located underneath an upper silicon (Si) layer, wherein the boron-doped SiGe layer is configured to propagate a fracture at an interface between the boron-doped SiGe layer and the bulk silicon substrate after hydrogenation of the boron-doped SiGe layer; and an alternate substrate bonded to the upper Si layer.

20 Claims, 4 Drawing Sheets

100

```
FORM BORON-DOPED SIGE LAYER IN BULK SI SUBSTRATE BELOW UPPER SI LAYER
101
```

```
HYDROGENATE BORON-DOPED SIGE LAYER
102
```

```
BOND UPPER SI LAYER TO ALTERNATE SUBSTRATE
103
```

```
PERFORM LAYER TRANSFER BY PROPAGATING FRACTURE
AT BORON-DOPED SIGE/BULK SI INTERFACE
101
```

LAYER TRANSFER USING BORON-DOPED SIGE LAYER

BACKGROUND

This disclosure relates generally to the field of layer transfer of a thin layer of silicon.

As the demand for alternative forms of energy increases, higher demands are placed on the conversion efficiency of photovoltaic cells such as solar cells. Simultaneously, the cost of such cells is expected to decrease. For silicon (Si) based solar cell technology, the trade-off between cell fabrication cost and conversion efficiency is directly related to the quality of the silicon used to fabricate the solar cell. Single-crystal (SC) silicon cells have relatively high efficiency, but also high cost. To form a single-crystal silicon-based solar cell, a layer of thin (<50 micrometers, or μm) silicon may be formed on an alternate substrate such as glass, ceramic or metal by a process referred to as layer transfer. However, successful layer transfer of a single-crystal layer of silicon may require the use of relatively expensive equipment and techniques.

SUMMARY

An exemplary embodiment of a method for layer transfer using a boron-doped silicon germanium (SiGe) layer includes forming a boron-doped SiGe layer on a bulk silicon substrate; forming an upper silicon (Si) layer over the boron-doped SiGe layer; hydrogenating the boron-doped SiGe layer; bonding the upper Si layer to an alternate substrate; and propagating a fracture at an interface between the boron-doped SiGe layer and the bulk silicon substrate.

An exemplary embodiment of a system for layer transfer using a boron-doped silicon germanium (SiGe) layer includes a bulk silicon substrate; a boron-doped SiGe layer formed on the bulk silicon substrate, such that the boron-doped SiGe layer is located underneath an upper silicon (Si) layer, wherein the boron-doped SiGe layer is configured to propagate a fracture at an interface between the boron-doped SiGe layer and the bulk silicon substrate after hydrogenation of the boron-doped SiGe layer; and an alternate substrate bonded to the upper Si layer.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES:

FIG. 4 illustrates an embodiment of a fracture propagated at an interface between the boron-doped SiGe layer and the bulk silicon substrate.

DETAILED DESCRIPTION

Embodiments of systems and methods for layer transfer using a boron-doped silicon germanium (SiGe) layer are provided, with exemplary embodiments being discussed below in detail. Addition of boron (B) to the SiGe layer allows a thin upper layer of silicon, which may comprise a single-crystal layer of silicon, to be transferred from a bulk silicon substrate onto an alternate substrate, such as glass, ceramic, plastic, or metal, using relatively low-cost processing steps and equipment. The boron-doped SiGe layer is hydrogenated to facilitate mechanical fracture propagation in the doped SiGe layer. The boron doping of the SiGe layer significantly enhances the efficiency with which hydrogen is trapped at the interface between the doped SiGe and the bulk silicon substrate; this increased hydrogen trapping efficiency allows for successful fracture propagation at the interface and layer transfer of the single-crystal silicon to an alternate substrate.

The boron concentration in the boron-doped SiGe layer may be greater than about $10^{19}$ B/cm$^3$. The boron-doped SiGe may be separated from the bulk silicon at the SiGe/Bulk silicon interface by fracturing along the interface. The boron-doped SiGe layer may be fully strained and grown using any appropriate method, including but not limited to rapid thermal chemical vapor deposition (RTCVD) epitaxial growth, molecular beam epitaxy (MBE), or clean evaporation (or any physical vapor deposition, or PVD) followed by solid-phase epitaxial growth (SPE).

Figure 1:
FIG. 1 illustrates an embodiment of a method for layer transfer using a boron-doped SiGe layer.
Figure 1:
Figure 1:
Figure 2:
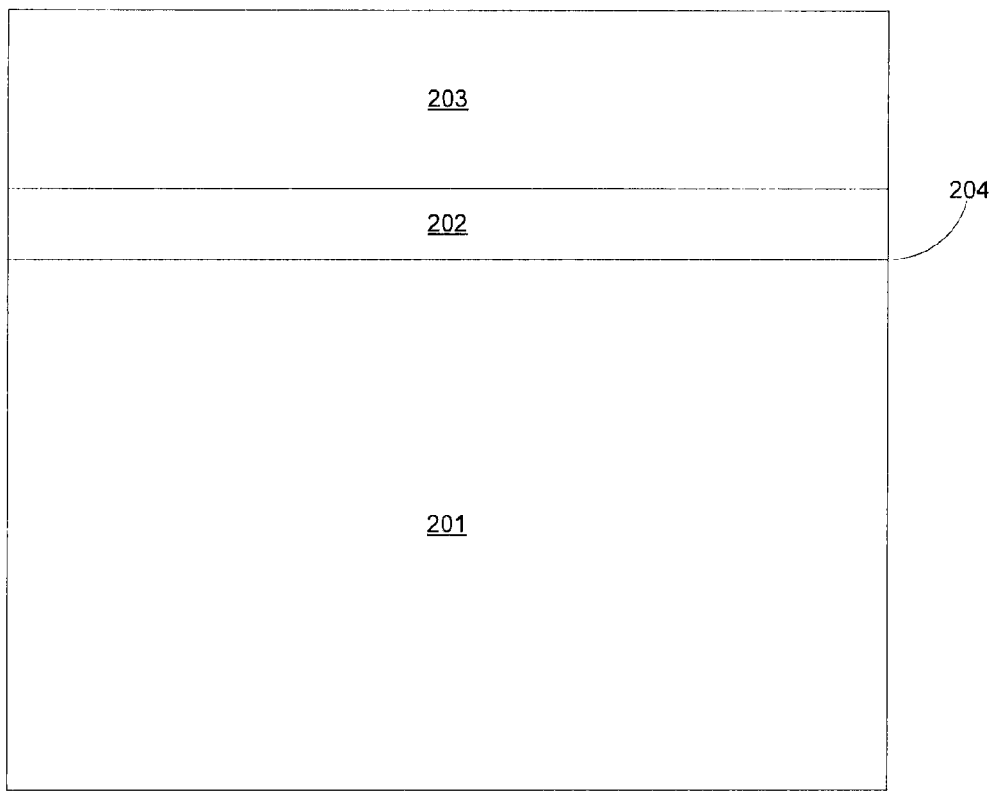
FIG. 2 illustrates an embodiment a boron-doped SiGe layer formed on a bulk silicon substrate.

FIG. 1 illustrates an embodiment of a method 100 of layer transfer using a boron-doped SiGe layer. FIG. 1 is discussed with reference to FIGS. 2-4. In block 101, as shown in wafer 200 of FIG. 2, a boron-doped SiGe layer 202 is formed in a bulk silicon substrate 201 below an upper silicon layer 203. Upper silicon layer 203 may be less than about 50 μm thick in some embodiments, and may comprise a single crystal layer in some embodiments. Upper silicon layer 203 may further comprise additional layers, materials, and/or devices, including but not limited to p-n diode structures in some embodiments. Interface 204 separates SiGe layer 202 and bulk silicon substrate 201.

The doping of the SiGe layer 202 may be achieved during the formation of the SiGe layer 202 using gaseous B-containing sources such as diborane, using solid and/or liquid sources such as B-doped Si or Ge during evaporation, or using B-metal in a Knudsen cell during MBE. Doping may also be achieved after a SiGe layer is formed using ion implantation techniques or B diffusion techniques (such as spin-on B-doped glass and annealing). The Ge content of the SiGe layer 202 may be between 5 and 50 atomic percent, and between 10 and 40 atomic percent in some embodiments. The thickness of the SiGe layer 202 may be between 1 and 1000 nm, and between 5 to 100 nm in some embodiments. The Ge content of the boron-doped SiGe layer 202 may not be constant throughout the SiGe layer in some embodiments.

The boron concentration in the doped SiGe layer 202 may be greater than about $10^{19}$ B/cm$^3$. The boron concentration may not be constant throughout the boron-doped SiGe layer 202 in some embodiments; it may be linearly graded, or spiked at an interface to encourage fracture propagation at the interface. The B-doped SiGe layer 202 may contain carbon (C) to control the amount or distribution of strain within the SiGe layer in some embodiments; the C content may be at or below 3%.

Formation of the doped SiGe layer 202 may be preceded by formation of an optional buffer layer in some embodiments. The buffer layer, which may be disposed between the bulk Si 201 and the doped SiGe layer 202, may comprise Si, carbon-doped Si (Si:C), or undoped SiGe. The optional buffer layer allows the recovery of the bulk Si 201 after layer transfer of the upper silicon layer 203 through use of controlled selective etching techniques, allowing for Si substrate reuse.

In block 102, boron-doped SiGe layer 301 is hydrogenated. Hydrogenation may be performed by exposing the wafer 200 to atomic hydrogen at a temperature of greater than 100° C. The atomic hydrogen may comprise direct current (DC) or radio frequency (RF) plasma, or energetic ions. In some embodiments, hydrogenation may be performed by exposure to 1000 W of RF hydrogen plasma for 30 minutes at 250° C. The hydrogen is trapped at interface 204. The boron in doped SiGe layer 202 increases the amount of hydrogen trapped at interface 204 during hydrogenation of boron-doped SiGe layer 202. The hydrogen may also be incorporated into the SiGe layer 202 through electrochemical means, which may use catalytic surface layers such as platinum (Pt) in some embodiments.

Figure 3:
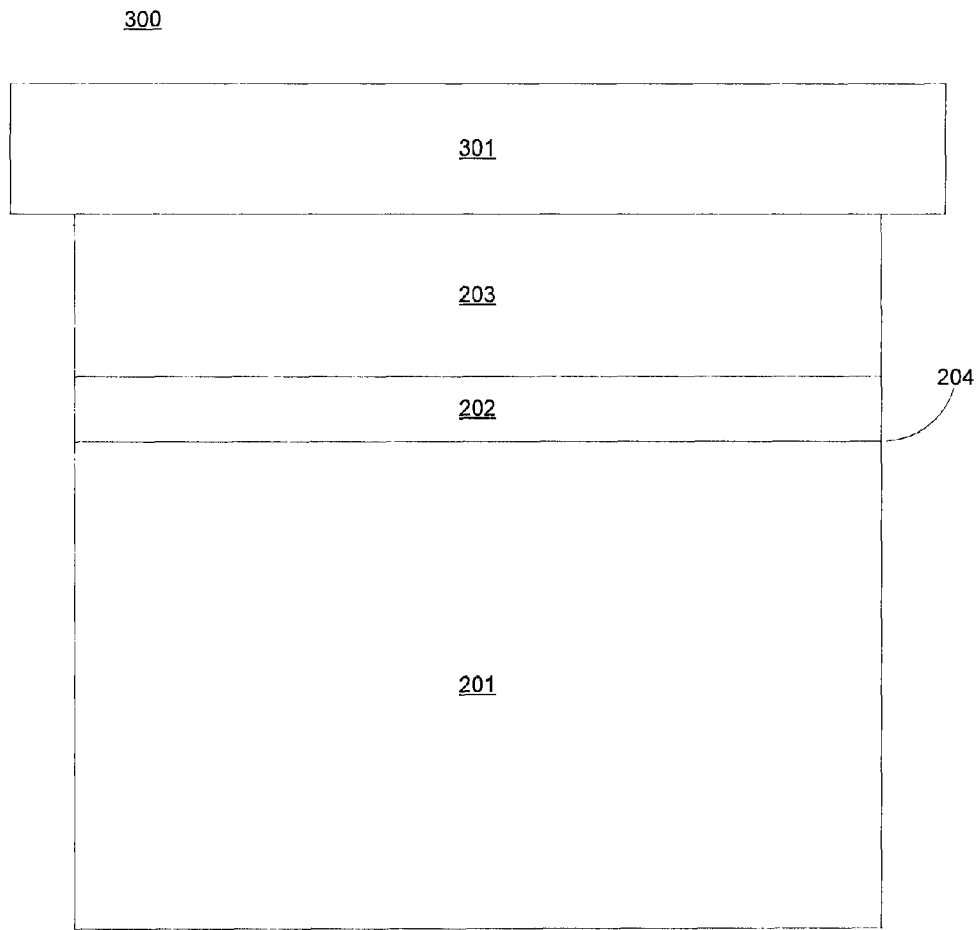
FIG. 3 illustrates an embodiment of a boron-doped SiGe layer formed on a bulk silicon substrate after bonding an alternate substrate to an upper silicon layer.

In block 103, as shown in FIG. 3, upper silicon layer 203 is bonded to an alternate substrate 301. Bonding may be performed by any appropriate method, including anodic, hydrophilic, or thermocompression bonding. Alternate substrate 301 may comprise any appropriate material, including but not limited to glass, ceramic, metal or plastic, or a combination thereof. The alternate substrate 301 may be chosen to have a coefficient of thermal expansion (CTE) that is the similar to the CTE of silicon, or may be selected such that the CTE of the alternate substrate 301 results in a predetermined residual strain in alternate substrate 301 after bonding and cooling.

Figure 4:
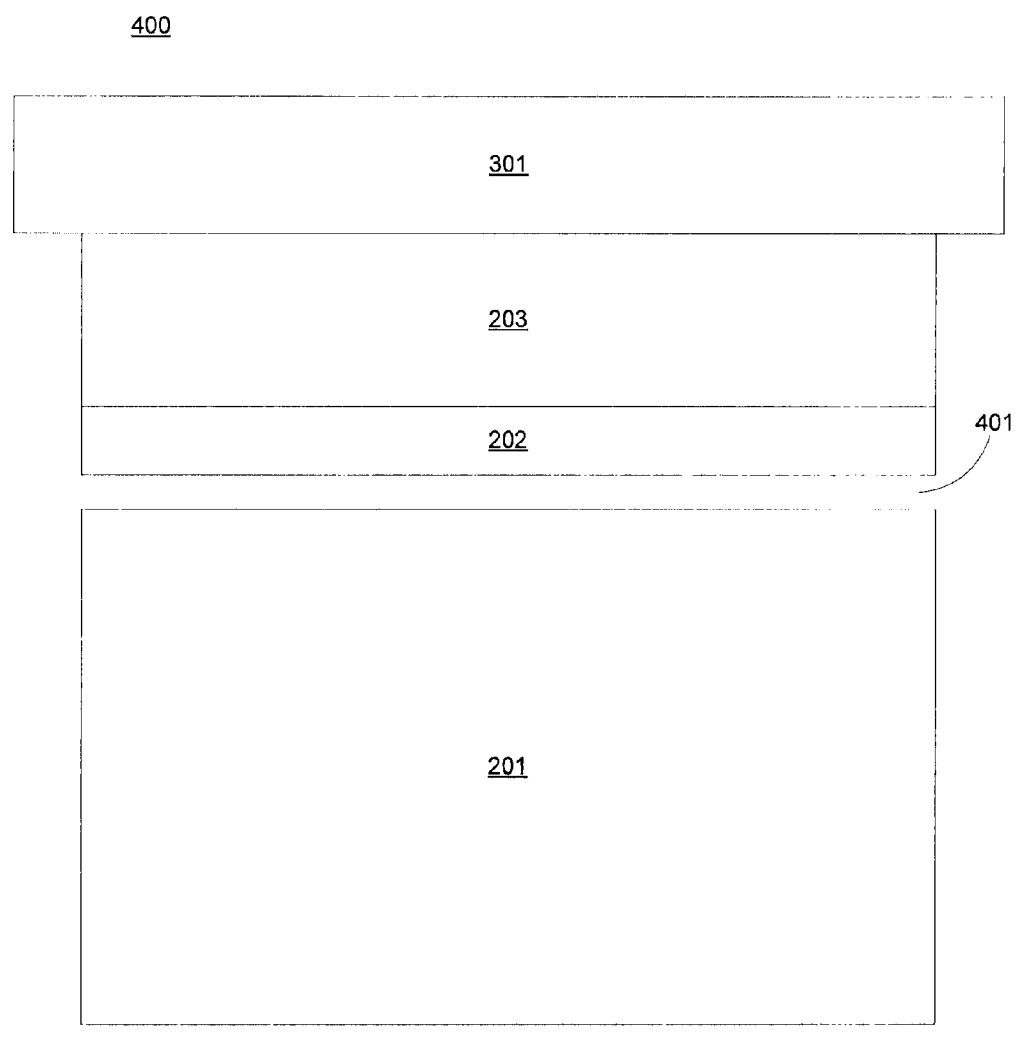

In block 104, as shown in FIG. 4, the bulk silicon substrate 201 is separated from the upper silicon layer 203 by propagating a fracture at interface 204, resulting in break 401. The hydrogen trapped at interface 204 promotes fracture propagation at interface 204 by weaking the local atomic bonding. An asymmetric concentration of Ge in boron-doped SiGe layer 202 may be used to restrict fracture to interface 204; or conversely, the Ge content (and optionally the B concentration) may be retrograded to promote fracture at the interface between SiGe layer 202 and upper silicon layer 203. Fracture and separation may be performed by applying an external force, by an intrinsic force due to residual strain resulting from varying CTEs between the bulk silicon 201 and alternate substrate 301, or by additional hydrogen loading, using plasma or acid. After upper silicon layer 203 is separated from bulk silicon substrate 201 by break 401, upper silicon layer 203 may be used to form a high-efficiency solar cell.

In an exemplary embodiment, a SiGe layer having 24 atomic percent concentration of Ge that is grown to a thickness of about 20 nm on a bulk Si wafer using a single-wafer reduced pressure rapid thermal chemical vapor deposition (RTCVD) system is covered with a 70 nm thick Si capping layer that is grown on the SiGe layer. The SiGe layer may be doped during growth using B at a concentration of about $2\times10^{20}$ B/cm$^3$. For comparison purposes, a structure comprising the above-described doped SiGe layer and a second structure comprising an undoped SiGe layer of the same dimensions are exposed to RF hydrogen plasma at 250° C. for a period of 30 minutes, and both structures are then anodically bonded to glass substrates at a bonding temperature of about 350° C. The structure comprising the B doped SiGe layer demonstrates relatively large area transfer of the SiGe and upper Si layer upon initiating fracture between the glass substrate and the layer-containing Si substrate, whereas the structure comprising the undoped SiGe layer does not successfully fracture in a manner that allowing large-area layer transfer along the SiGe interface. Addition of raised Ge content, longer H exposure, or different fracture strategies also failed to produce large area layer transfer when the SiGe was undoped.

The technical effects and benefits of exemplary embodiments include relatively low-cost layer transfer of a single-crystal silicon layer onto a substrate.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for layer transfer using a boron-doped silicon germanium (SiGe) layer, the method comprising:
    forming a boron-doped SiGe layer on a bulk silicon substrate;
    forming an upper silicon (Si) layer over the boron-doped SiGe layer;
    hydrogenating the boron-doped SiGe layer;
    bonding the upper Si layer to an alternate substrate; and
    propagating a fracture at an interface between the boron-doped SiGe layer and the bulk silicon substrate.

2. The method of claim 1, wherein a doping concentration of boron (B) in the boron-doped SiGe layer is greater than about $10^{19}$ B/cm$^3$.

3. The method of claim 1, wherein the boron-doped SiGe layer comprises between about 10% and about 40% germanium (Ge).

4. The method of claim 1, wherein the boron-doped SiGe layer comprises a graded concentration of Ge, such that the Ge concentration is configured to contain fracture propagation to the interface.

5. The method of claim 1, wherein a concentration of boron in the boron-doped SiGe layer is non-uniform.

6. The method of claim 1, wherein the alternate substrate comprises one or more of metal, glass, ceramic, or plastic.

7. The method of claim 1, wherein hydrogenating the boron-doped SiGe layer comprises trapping hydrogen at the interface between the boron-doped SiGe layer and the bulk silicon substrate.

8. The method of claim 1, wherein hydrogenating the boron-doped SiGe layer comprises trapping hydrogen at an interface between the boron-doped SiGe layer and the upper Si layer.

9. The method of claim 1, wherein propagating a fracture at the interface between the boron-doped SiGe layer and the bulk silicon substrate comprises additional hydrogen loading.

10. The method of claim 1, wherein the upper Si layer comprises a single crystal silicon layer.

11. The method of claim 1, wherein the upper Si layer comprises one or more of an electrically doped region or an electrical device structure.

12. A system for layer transfer using a boron-doped silicon germanium (SiGe) layer, the system comprising:
- a bulk silicon substrate;
- a boron-doped SiGe layer formed on the bulk silicon substrate, such that the boron-doped SiGe layer is located underneath an upper silicon (Si) layer, wherein the boron-doped SiGe layer is configured to propagate a fracture at an interface between the boron-doped SiGe layer and the bulk silicon substrate after hydrogenation of the boron-doped SiGe layer; and
- an alternate substrate bonded to the upper Si layer.

13. The system of claim 12, wherein a doping concentration of boron (B) in the boron-doped SiGe layer is greater than about $10^{19}$ B/cm$^3$.

14. The system of claim 12, wherein the boron-doped SiGe layer comprises between about 10% and 40% germanium (Ge).

15. The system of claim 12, wherein the boron-doped SiGe layer comprises a graded concentration of Ge, such that the Ge concentration is configured to contain fracture propagation to the interface.

16. The system of claim 12, wherein the alternate substrate comprises one or more of metal, glass, ceramic or plastic.

17. The system of claim 12, wherein the boron-doped SiGe layer is configured to trap hydrogen at the interface between the boron-doped SiGe layer and the bulk silicon substrate during hydrogenation.

18. The system of claim 12, wherein the fracture is propagated at the interface between the boron-doped SiGe layer and the bulk silicon substrate by additional hydrogen loading.

19. The system of claim 12, wherein the upper Si layer comprises a single crystal silicon layer.

20. The system of claim 12, wherein the upper Si layer comprises one or more of an electrically doped region or an electrical device structure.

* * * * *